US009385161B2

(12) United States Patent
Park

(10) Patent No.: US 9,385,161 B2
(45) Date of Patent: Jul. 5, 2016

(54) SEMICONDUCTOR INTEGRATED CIRCUIT DEVICE HAVING RESERVOIR CAPACITOR AND METHOD OF MANUFACTURING THE SAME

(71) Applicant: SK hynix Inc., Gyeonggi-do (KR)

(72) Inventor: Hae Chan Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 5 days.

(21) Appl. No.: 14/477,574

(22) Filed: Sep. 4, 2014

(65) Prior Publication Data

US 2015/0357377 A1 Dec. 10, 2015

(30) Foreign Application Priority Data

Jun. 9, 2014 (KR) ........................ 10-2014-0069238

(51) Int. Cl.
H01L 27/24 (2006.01)
H01L 29/40 (2006.01)
H01L 49/02 (2006.01)
H01L 29/66 (2006.01)
H01L 27/08 (2006.01)
H01L 29/94 (2006.01)

(52) U.S. Cl.
CPC ........ H01L 27/2436 (2013.01); H01L 27/0805 (2013.01); H01L 28/60 (2013.01); H01L 29/66181 (2013.01); H01L 29/94 (2013.01)

(58) Field of Classification Search
CPC ............ H01L 23/5223; H01L 27/0629; H01L 27/0727; H01L 27/0733; H01L 28/40; H01L 27/10894; H01L 27/11531
See application file for complete search history.

(56) References Cited

U.S. PATENT DOCUMENTS

| 6,423,997 | B1* | 7/2002 | Takahashi | ........... | H01L 21/3144 |
| | | | | | 257/298 |
| 2001/0025972 | A1* | 10/2001 | Moriwaki | ........... | H01L 27/0629 |
| | | | | | 257/296 |
| 2008/0197398 | A1* | 8/2008 | Komukai | ............ | H01L 27/0629 |
| | | | | | 257/306 |
| 2012/0034751 | A1* | 2/2012 | Ariyoshi | ......... | H01L 21/823462 |
| | | | | | 438/381 |

FOREIGN PATENT DOCUMENTS

KR 1020060068849 6/2006
KR 100667919 1/2007

* cited by examiner

Primary Examiner — Matthew W Such
Assistant Examiner — David Spalla
(74) Attorney, Agent, or Firm — IP & T Group LLP

(57) ABSTRACT

A semiconductor integrated circuit device having a reservoir capacitor and a method of manufacturing the same are provided. A first insulating layer is formed on a semiconductor substrate including a first region and a second region. A first conductive layer is formed on the first insulating layer, and a second insulating layer is formed on the first conductive layer. The second insulating layer is patterned to be left in a portion of the first region. A second conductive layer is formed on the second insulating layer and the first conductive layer. The second conductive layer is etched to expose a partial surface of the first conductive layer in the first region. The second conductive layer and the first conductive layer are etched to form a reservoir capacitor in the first region and form a gate in the second region.

21 Claims, 4 Drawing Sheets

SEMICONDUCTOR INTEGRATED CIRCUIT DEVICE HAVING RESERVOIR CAPACITOR AND METHOD OF MANUFACTURING THE SAME

CROSS-REFERENCES TO RELATED APPLICATION

This application claims priority under 35 U.S.C. 119(a) to Korean application No. 10-2014-0069238, filed on Jun. 9, 2014, in the Korean intellectual property Office, which is incorporated by reference in its entirety.

BACKGROUND

1. Technical Field

The inventive concept relates to a semiconductor integrated circuit device, and more particularly, to a variable resistive memory device having a reservoir capacitor, and a method of manufacturing the same.

2. Related Art

Currently, high integration, low voltage, and high speed are key performance considerations in semiconductor integrated circuit devices. The semiconductor integrated circuit devices need to operate with low voltage consumption and require various levels of power voltage. However, as is well-known, when power voltage is supplied to the semiconductor integrated circuit device, noise is inevitable, and the noise affects the signal transfer characteristics of the device, including signal delay.

Therefore, capacitors for noise removal, for example, reservoir capacitors are currently formed in a peripheral region of the semiconductor integrated circuit. The variable resistive memory devices such as phase-change random access memories (PCRAMs) also require reservoir capacitors. Therefore, there is a demand for a simple method of manufacturing a reservoir capacitor.

SUMMARY

According to an embodiment, a method of manufacturing a semiconductor integrated circuit device is provided. The method may include forming a first insulating layer on a semiconductor substrate including a first region and a second region. A first conductive layer is formed over the first insulating layer, and a second insulating layer is formed over the first conductive layer. The second insulating layer is patterned to form a second insulating pattern in the first region. A second conductive layer is formed over the second insulating pattern in the first region and over the first conductive layer in the second region. The second conductive layer and the second insulating pattern in the first region are etched to expose a partial surface of the first conductive layer in the first region. The second conductive layer and the first conductive layer in the first regions and the second regions are etched to form a reservoir capacitor in the first region and form a gate in the second region.

According to an embodiment, a method of manufacturing a semiconductor integrated circuit device is provided. The method may include forming a first insulating layer over a semiconductor substrate in which a reservoir capacitor region and a cell region are defined. A first conductive layer and a second insulating layer are sequentially stacked over the first insulating layer. The second insulating layer is selectively left in a first portion of the reservoir capacitor region to expose the first conductive layer in a second portion of the capacitor region and in the cell region. A second conductive layer is formed over the second insulating layer left in the first portion of the reservoir capacitor region and over the first conductive layer exposed in the second portion of the capacitor region and in the cell region. The second conductive layer and the first conductive layer are etched to form a reservoir capacitor in the first portion of the reservoir capacitor region and form a gate in the cell region. The second conductive layer and the first conductive layer serve as electrons of the reservoir capacitor.

According to an embodiment, a semiconductor integrated circuit device is provided. The semiconductor integrated circuit device may include a reservoir capacitor formed in a first region and including a stack structure of a first electrode, a second electrode, a third electrode and dielectric layers, wherein the dielectric layers are interposed between the first and second electrodes and between the second and the third electrodes, and a gate formed in a second region. The gate may include a stacking layer of the second electrode and the third electrode which are in direct contact with each other.

The first electrode may be the semiconductor substrate, and the second and third electrodes may include conductive layers. The semiconductor substrate includes a substrate bias region formed in the first region.

The first and third electrodes of the reservoir capacitor may be formed to receive voltages different from the second electrode.

According to an embodiment, a method of manufacturing a semiconductor integrated circuit device is provided. The method may include providing a substrate including first, second, and third regions. A first insulating layer is formed over the semiconductor in the first, the second, and the third regions. A first conductive layer is formed over the first insulating layer in the first, the second, and the third regions. A second insulating layer is formed over the first conductive layer in the first region. A second conductive layer is formed over the second insulating layer in the first region and over the first conductive layer in the second and the third regions. The second conductive layer, the second insulating layer, and the first conductive layer in the first region are patterned to form a reservoir capacitor in the first region. The second conductive layer and the first conductive layer in the second and the third regions are patterned to form first and second gates in the second and the third regions, respectively.

These and other features, aspects, and embodiments are described below in the section entitled "DETAILED DESCRIPTION".

BRIEF DESCRIPTION OF THE DRAWINGS

The above and other aspects, features and other advantages of embodiments will be more clearly understood from the following detailed description taken in conjunction with the accompanying drawings, in which.

DETAILED DESCRIPTION

Figure 1:
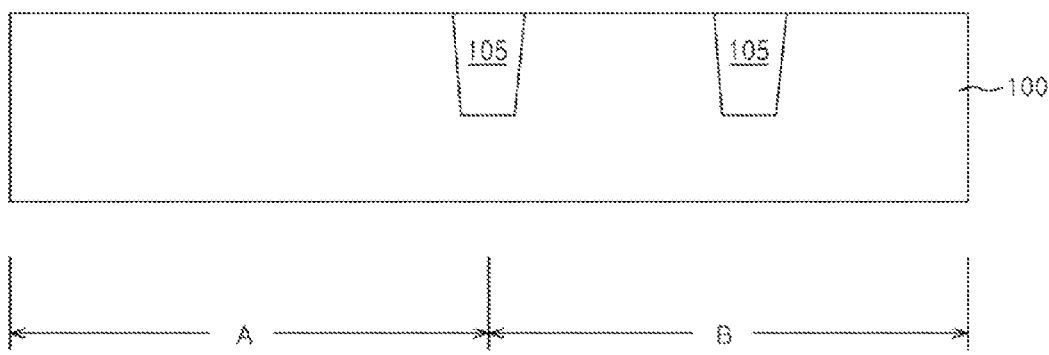
FIG. 1 is a cross-sectional view illustrating a method of manufacturing a semiconductor integrated circuit device including a reservoir capacitor according to an embodiment.

Exemplary embodiments will be described in greater detail with reference to the accompanying drawings. Exemplary embodiments are described herein with reference to schematic illustrations of exemplary embodiments (and intermediate structures). As such, variations in the shapes are expected depending on manufacturing techniques and/or tolerances. Thus, exemplary embodiments should not be construed as limited to the particular shapes of regions illustrated herein but it should be understood that deviations in shapes are possible. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Additionally, it should be appreciated that changes and modifications may be made to these exemplary embodiments and the resultant apparatus or method may still fall within the scope and spirit of the claims.

Referring to FIG. 1, a semiconductor substrate 100 is prepared. The semiconductor substrate 100 may be, for example, a silicon (Si) substrate, and a shallow trench isolation (STI) type device isolation layer 105 may be formed. In FIGS. 1 to 8, a region A may be a first peripheral region in which a reservoir capacitor is to be formed, and a region B may be a cell region or a second peripheral region in which a circuit part including transistors are to be formed.

Figure 2:
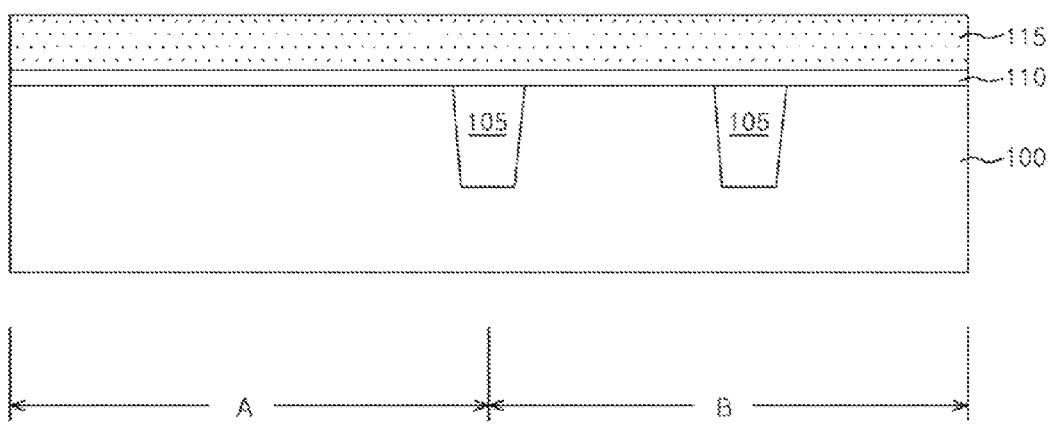
FIG. 2 is a cross-sectional view illustrating a method of manufacturing a semiconductor integrated circuit device including a reservoir capacitor according to an embodiment.

Referring to FIG. 2, a first insulating layer 110 may be formed on a surface of the semiconductor substrate 100. The first insulating layer 110 may be used as a capacitor dielectric layer in the region A and a gate insulating layer in the region B. The first insulating layer 110 may be formed of a silicon oxide layer, but the material for the first insulating layer 110 is not limited thereto. A first conductive layer 115 may be formed on the first insulating layer 110. The first conductive layer 115 may include, for example, a doped polysilicon layer.

Figure 3:
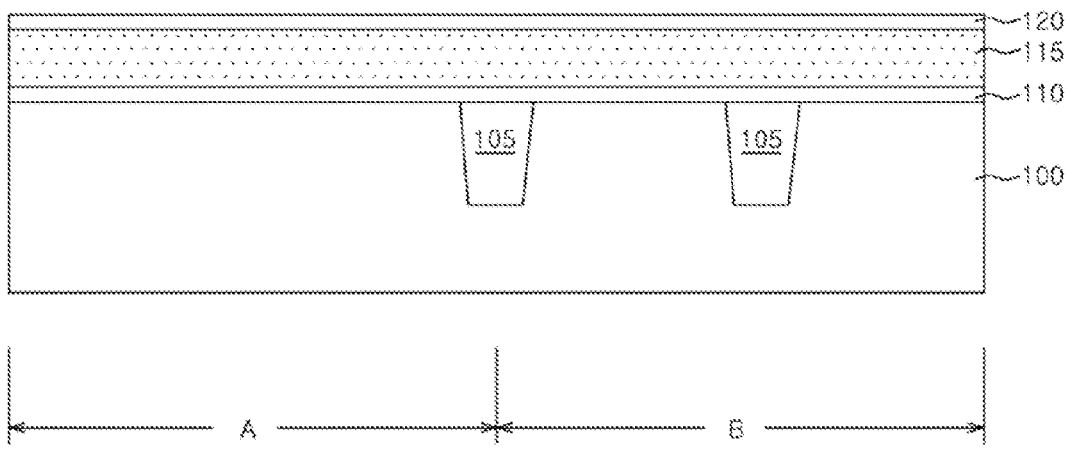
FIG. 3 is a cross-sectional view illustrating a method of manufacturing a semiconductor integrated circuit device including a reservoir capacitor according to an embodiment.

Referring to FIG. 3, a second insulating layer 120 is formed on the first conductive layer 115. The second insulating layer 120 may also include a silicon oxide layer, but the material for the second insulating layer 120 is not limited thereto.

Figure 4:
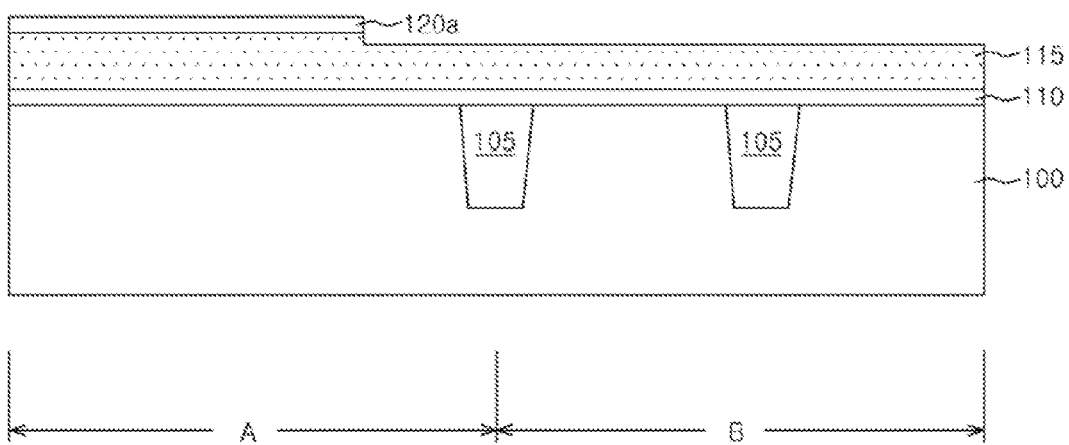
FIG. 4 is a cross-sectional view illustrating a method of manufacturing a semiconductor integrated circuit device including a reservoir capacitor according to an embodiment.

Referring to FIG. 4, a predetermined portion of the second insulating layer 120 is removed, and thus the second insulating layer 120 may be used as a dielectric layer of the reservoir capacitor. The reference numeral 120a denotes a patterned second insulating layer. The second insulating layer 120a may be located on a predetermined portion of the region A, and the region A may be divided into a region in which the second insulating layer 120a is exposed, and a region in which the first conductive layer 115 is exposed.

Figure 5:
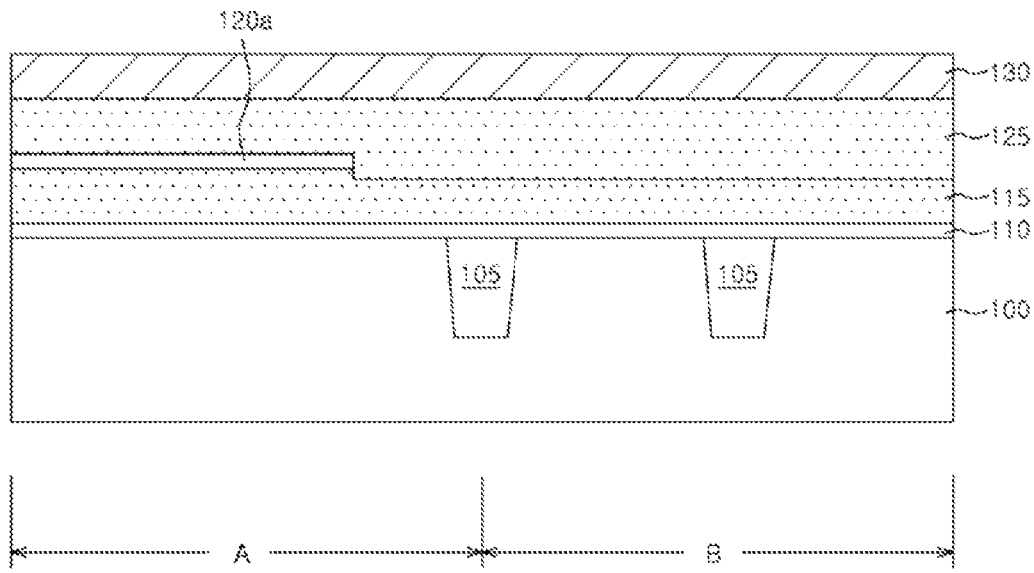
FIG. 5 is a cross-sectional view illustrating a method of manufacturing a semiconductor integrated circuit device including a reservoir capacitor according to an embodiment.

Referring to FIG. 5, a second conductive layer 125 is formed on the second insulating layer 120a and the first conductive layer 115. The second conductive layer 125 may be formed of the same material as the first conductive layer 115, for example, a doped polysilicon layer. However, the material for the second conductive layer 125 is not limited thereto, and may include various conductive material layers. A third conductive layer 130 is formed on the second conductive layer 125. The third conductive layer 130 may include, for example, a transition metal silicide layer. The transition metal silicide layer may be formed through a process of depositing a transition metal layer on the second conductive layer 125, and performing a heat treatment on the transition metal layer and the second conductive layer 125.

Figure 6:
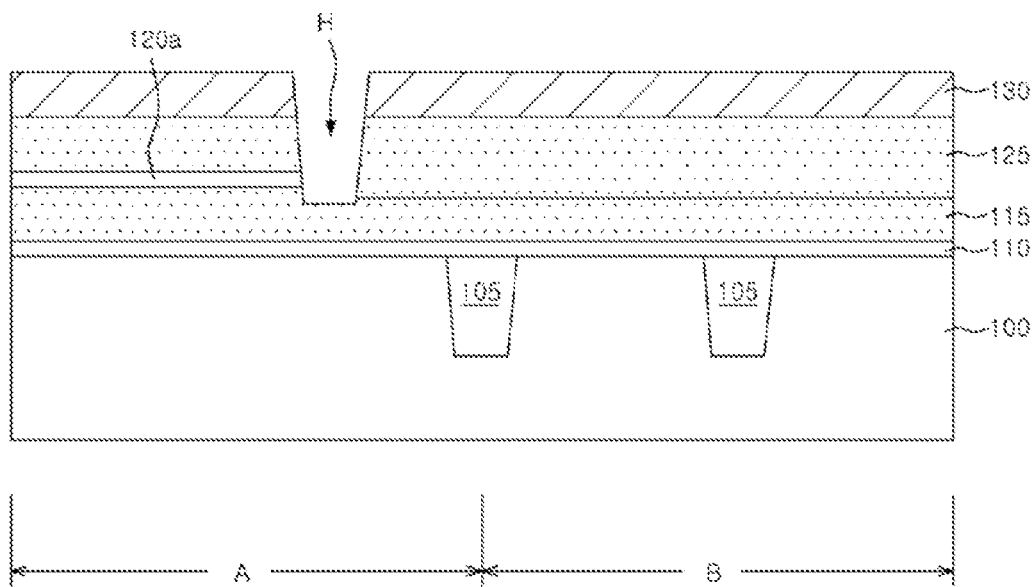
FIG. 6 is a cross-sectional view illustrating a method of manufacturing a semiconductor integrated circuit device including a reservoir capacitor according to an embodiment.

Referring to FIG. 6, a process of exposing a portion of the first conductive layer 115 in the region A may be performed. For example, to couple the first conductive layer 115 and an external power line, predetermined portions of the third conductive layer 130, the second conductive layer 125, and the second insulating layer 120a, which are located in the region A, may be etched to form a hole H exposing a surface of the first conductive layer 115.

Figure 7:
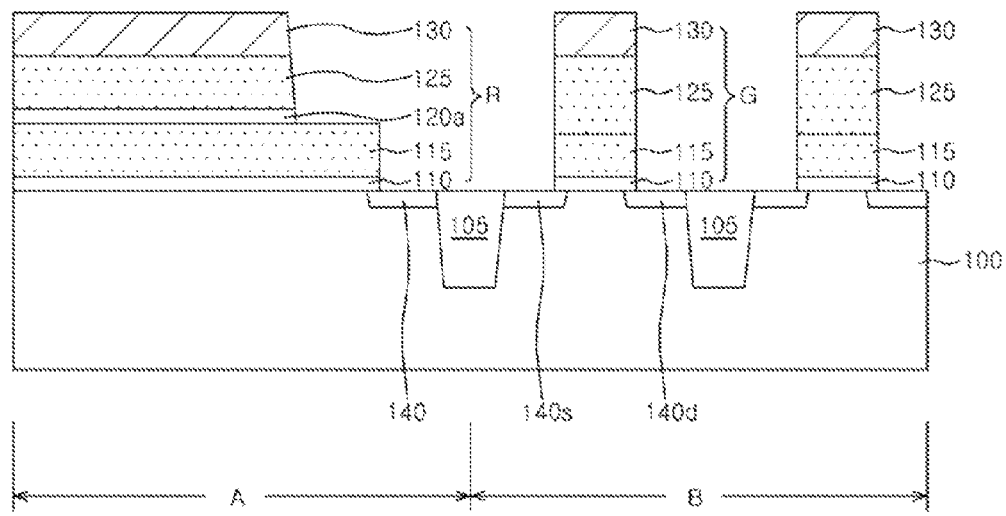
FIG. 7 is a cross-sectional view illustrating a method of manufacturing a semiconductor integrated circuit device including a reservoir capacitor according to an embodiment.

Referring to FIG. 7, the third conductive layer 130, the second conductive layer 125, the first conductive layer 115, and the first insulating layer 110 in the region A, in which the second insulating layer 120a is not located, and the region B are etched. Then, a reservoir capacitor R is formed in the region A and a gate G is formed in the region B. In the reservoir capacitor R formed in the region A, surfaces of the third conductive layer 130 and the first conductive layer 115 are exposed outside.

Impurity regions 140, 140s, and 140d are formed in the semiconductor substrate 100 exposed through the reservoir capacitor R and the gate G. The impurity region 140 may be a substrate bias region 140 for providing a bias to the semiconductor substrate 100 in the region A. The impurity region 140s may denote a source region of a transistor, and the impurity region 140d may denote a drain region of the transistor.

Figure 8:
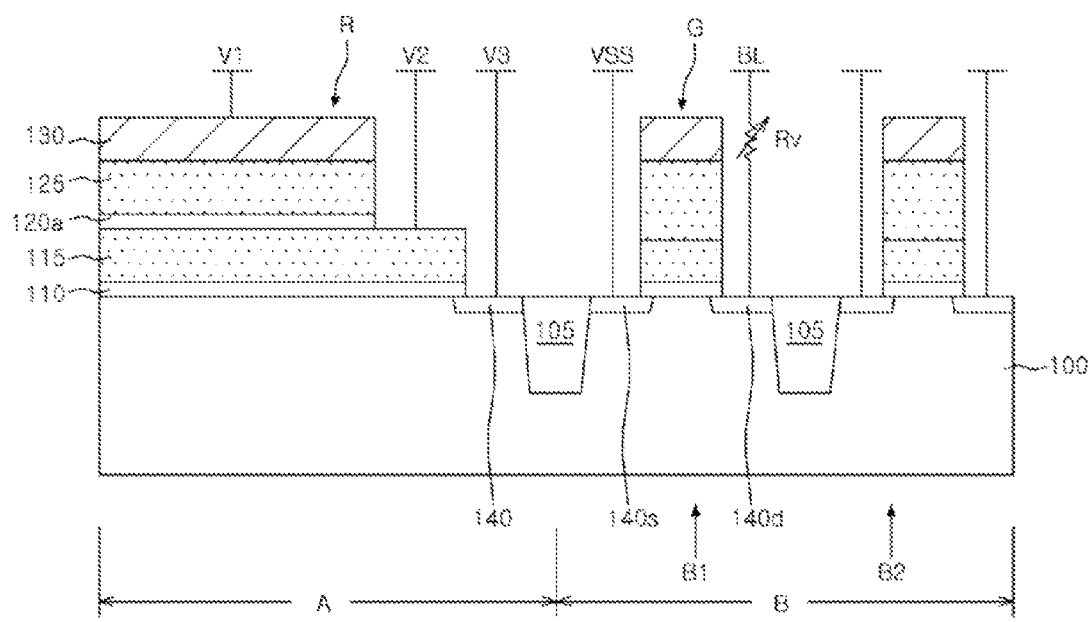
FIG. 8 is a cross-sectional view illustrating a method of manufacturing a semiconductor integrated circuit device including a reservoir capacitor according to an embodiment.

Referring to FIG. 8, a first power voltage terminal V1 is electrically coupled to the third conductive layer 135 constituting the reservoir capacitor R, a second power voltage terminal V2 is electrically coupled to the first conductive layer 115 constituting the reservoir capacitor R, and a third power voltage terminal V3 is electrically coupled to the substrate bias region 140. Although not shown in FIG. 8, the phrase "electrically coupled" may include direct contact and indirect connection through a plurality of contacts and interconnection lines.

In an embodiment, the reservoir capacitor may include a first reservoir capacitor formed between the stacked third and second conductive layers 130 and 125 and the first conductive layer 115, and a second reservoir capacitor formed between the first conductive layer 115 and the semiconductor substrate 100. To obtain large capacity, the first and second reservoir capacitors may be electrically coupled in parallel. For example, the first and second power voltages V1 and V3 may be implemented to have a voltage difference from the second power voltage V2 to induce the substantial parallel connection of the first and second reservoir capacitors. In an embodiment, the first and third power voltages V1 and V3 may have voltage levels smaller than that of the second power voltage V2, and the first and third power voltages V1 and V3 may have the same voltage level.

The source region 140s corresponding to a cell region B1 in the region B may be electrically coupled to a ground voltage terminal Vss, and the drain region 140d may be electrically coupled to a variable resistor Rv and a bit line BL. In another embodiment, the drain region 140d of the cell region B1 may be electrically coupled to the bit line BL without the variable resistor Rv interposed therebetween.

A source and drain corresponding to a peripheral circuit region B2 in the region B may be electrically coupled to various voltage lines or various interconnection lines according to a circuit configuration.

According to the embodiment, a multi-stage reservoir capacitor may be manufactured simultaneously when gates are formed in a cell region and a peripheral region. Thus, the reservoir capacitor having a large capacity may be manufactured without additional processes to improve signal transfer characteristics.

The above embodiment is illustrative and not limitative. Various alternatives are possible. Embodiments are not limited to any specific type of semiconductor device. Other additions, subtractions, or modifications that fall within the scope and spirit of the claims are possible.

What is claimed is:

1. A method of manufacturing a semiconductor integrated circuit device, the method comprising:
    forming a first insulating layer over a semiconductor substrate including a first region and a second region;
    forming a first conductive layer over the first insulating layer;
    forming a second insulating layer over the first conductive layer;
    patterning the second insulating layer to form a second insulating pattern in the first region and expose the first conductive layer in the second region;
    forming a second conductive layer over the second insulating pattern in the first region and over the first conductive layer in the second region;
    etching the second conductive layer and the second insulating pattern in the first region to expose a partial surface of the first conductive layer in the first region; and
    etching the second conductive layer and the first conductive layer in the first region and the second region to simultaneously form a reservoir capacitor in the first region and a gate in the second region, wherein the reservoir capacitor includes a first electrode and a second electrode, wherein the second electrode has a line width narrower than that of the first electrode,
    wherein the first electrode is formed of the first conductive layer and the second electrode is formed of the second conductive layer.

2. The method of claim 1, wherein one or both of the first conductive layer and the second conductive layer includes a doped polysilicon layer.

3. The method of claim 1, wherein the first conductive layer includes a different material from the second conductive layer.

4. The method of claim 1, further comprising, between the forming of the second conductive layer and the etching of the second conductive layer and the second insulating pattern in the first region to expose the partial surface of the first conductive layer, forming a third conductive layer over the second conductive layer,
    wherein the third conductive layer is simultaneously etched when the second conductive layer and the first conductive layer are etched to form the reservoir capacitor in the first region and the gate in the second region.

5. The method of claim 4, wherein the third conductive layer includes a transition metal silicide layer.

6. The method of claim 4, wherein the forming of the reservoir capacitor includes etching predetermined portions of the third conductive layer, the second conductive layer, and the first conductive layer to expose surfaces of the third conductive layer, the first conductive layer, and the semiconductor substrate in the first region.

7. The method of claim 1, further comprising, after the forming of the reservoir capacitor and the gate, forming impurity regions in the semiconductor substrate,
    wherein the impurity region formed in the first region serves as a substrate bias region, and
    wherein the impurity region formed in the second region serves as a source region and a drain region.

8. The method of claim 7, wherein the first region is a peripheral circuit region, and the second region is a cell region.

9. The method of claim 8, further comprising:
    coupling a first power voltage terminal to the second conductive layer constituting the reservoir capacitor,
    coupling a second power voltage terminal to the first conductive layer constituting the reservoir capacitor, and
    coupling a third power voltage terminal to the substrate bias region,
    wherein the reservoir capacitor is formed to have voltage differences between the first and second power voltage terminals and between the second and third power voltage terminals.

10. The method of claim 9, wherein voltage levels of the first and third power voltage terminals are smaller than that of the second power voltage terminal.

11. A method of manufacturing a semiconductor integrated circuit device, the method comprising:
    forming a first insulating layer over a semiconductor substrate in which a reservoir capacitor region and a cell region are defined;
    sequentially stacking a first conductive layer and a second insulating layer over the first insulating layer;
    etching the second insulating layer to be selectively left in a first portion of the reservoir capacitor region, and exposing the first conductive layer in a second portion of the capacitor region and in the cell region;
    forming a second conductive layer over the second insulating layer left in the first portion of the reservoir capacitor region and over the first conductive layer exposed in the second portion of the capacitor region and in the cell region; and
    etching the second conductive layer and the first conductive layer to simultaneously form a reservoir capacitor in the first portion of the reservoir capacitor region, and a gate in the cell region,
    wherein the second conductive layer and the first conductive layer serve as capacitor electrodes of the reservoir capacitor,
    wherein the reservoir capacitor includes at least one step between the capacitor electrodes.

12. The method of claim 11, further comprising forming junction regions by implanting impurities into the semiconductor substrate.

13. The method of claim 12, wherein the forming of the reservoir capacitor includes:
    partially expositing a top of the first conductive layer by etching portions of the second conductive layer and the second insulating layer located in the first portion of the reservoir capacitor region; and
    patterning the first conductive layer located in the first and second portions of the reservoir capacitor region to expose the semiconductor substrate.

14. The method of claim 11, wherein the first conductive layer includes a doped polysilicon layer.

15. The method of claim 14, wherein the forming of the second conductive layer includes:

forming a doped polysilicon layer over the second insulating layer located in the first portion of the reservoir capacitor region and over the first conductive layer located in the second portion of the reservoir capacitor region and the cell region; and forming a metal silicide layer over the doped polysilicon layer.

16. The method of claim 12, further comprising:

coupling a first power voltage terminal to the second conductive layer in the first portion of the reservoir capacitor region, coupling a second power voltage terminal to the first conductive layer in the second portion of the reservoir capacitor region, and coupling a third power voltage terminal to the semiconductor substrate in the second portion of the reservoir capacitor region, wherein the reservoir capacitor is formed to have voltage differences between the first and second power voltage terminals and between the second and third power voltage terminals.

17. The method of claim 16, wherein voltage levels of the first and third power voltage terminals are smaller than that of the second power voltage terminal.

18. A method of manufacturing a semiconductor integrated circuit device, the method comprising:

providing a substrate including first, second, and third regions;

forming a first insulating layer over the semiconductor in the first, the second, and the third regions;

forming a first conductive layer over the first insulating layer in the first, the second, and the third regions;

forming a second insulating layer over the first conductive layer;

patterning the second insulating layer to form a second insulating pattern in the first region and expose the first conductive layer in the second and third region;

forming a second conductive layer over the second insulating layer in the first region and over the first conductive layer in the second and the third regions;

forming a hole in the second conductive layer to expose the first conductive layer of the first region; and patterning the second conductive layer and the first conductive layer to simultaneously form (i) first and second gates in the second and the third regions, respectively, and (ii) a reservoir capacitor in the first region, wherein the reservoir capacitor includes at least one step between capacitor electrodes.

19. The method of claim 18, wherein the first region is a first peripheral region, wherein the second region is a first cell region, and wherein the first gate is a first cell gate.

20. The method of claim 19, wherein the third region is a second peripheral region, and wherein the third gate is a peripheral gate.

21. The method of claim 19, wherein the third region is a second cell region, and wherein the third gate is a second cell gate.

* * * * *